United States Patent [19]

Gillery

[11] 4,017,661
[45] Apr. 12, 1977

[54] ELECTRICALLY CONDUCTIVE TRANSPARENT LAMINATED WINDOW

[75] Inventor: Frank H. Gillery, Allison Park, Pa.

[73] Assignee: PPG Industries, Inc., Pittsburgh, Pa.

[22] Filed: Jan. 19, 1976

[21] Appl. No.: 650,400

Related U.S. Application Data

[62] Division of Ser. No. 495,974, Aug. 9, 1974, Pat. No. 3,962,488.

[52] U.S. Cl. .............................. 428/412; 428/413; 428/430; 428/432; 428/441; 428/472; 428/480; 428/500; 428/539

[51] Int. Cl.² .......................................... B32B 27/36

[58] Field of Search .......... 428/441, 430, 432, 412, 428/413, 480, 469, 472, 538, 539, 918, 500

[56] References Cited

UNITED STATES PATENTS 3,698,946 10/1972 Kaspaul et al. .................... 428/539
3,962,488 6/1976 Gillery .............................. 427/109

*Primary Examiner*—Cameron K. Weiffenbach
*Attorney, Agent, or Firm*—E. Kears Pollock; William J. Uhl

[57] ABSTRACT

An optically clear, electrically conductive, transparent coating on a substrate and a method of coating are disclosed. The coating comprises a first transparent layer deposited as $TiO_x$ on the substrate, where x preferably has a value within the range of 1.3 to 1.7, a layer of silver or gold deposited on the first layer, and a third transparent layer deposited as $TiO_x$ on the second layer, where x preferably has a value within the range of 1.3 to 1.7. The coating is deposited under vacuum in a partial pressure of oxygen on a rigid transparent substrate such as glass or a flexible plastic substrate and the resultant coated substrate used in electrically heated windows.

11 Claims, 4 Drawing Figures

ELECTRICALLY CONDUCTIVE TRANSPARENT LAMINATED WINDOW

This is a division of application Ser. No. 495,974, filed Aug. 9, 1974, now U.S. Pat. No. 3,962,488.

BACKGROUND OF THE INVENTION

1. Field of the Invention

This invention relates to electrically conductive coatings and more particularly relates to electrically conductive coatings on rigid transparent substrates such as glass or flexible plastic substrates. In a more particular aspect, the present invention relates to heated windows, particularly heated motor vehicular windows employing such substrates.

2. Brief Description of the Prior Art

U.S. Pat. No. 3,698,946 to Kaspaul et al discloses transparent, electrically conductive coatings on glass or flexible plastic substrates. The coatings are a composite layer comprising a first layer deposited as titanium monoxide, an intermediate layer of metal which may be copper, silver, gold, palladium or tin, and a third layer deposited as titanium monoxide. The coated articles are disclosed as being useful in solid state photo detectors, light emitting devices, image converters and image amplifiers. Unfortunately, these coatings give the coated article a combination of relatively high sheet resistances and low luminous transmittances. Typical sheet resistances and luminous transmittances set forth in the Kaspaul et al patent for coated glass and plastic substrates are about 1,600 to 200,000 ohms per square and 38 to 76 percent, respectively. These properties make the coatings undesirable for motor vehicle windshields which require a combination of high luminous transmittances, on the order of 80 percent or more, and low sheet resistances, on the order of about 1 to 10 ohms per square, to develop useful amounts of heat obtainable with motor vehicle generator voltage.

It has been found that the luminous transmittances of the coated articles described in the above paragraph can be improved if the titanium oxide layers are deposited as titanium dioxide. Such films are colorless, whereas films deposited as titanium monoxide transmit blue. However, films deposited as titanium dioxide are surprisingly not compatible with the subsequently deposited silver layer. The silver film, although initially continuous and of high conductivity, breaks down rapidly and becomes non-continuous, resulting in a drastic increase in resistance and lowering of the luminous transmittance over a short period of time, i.e., less than 24 hours. Surprisingly, it has been found that when the layers of titanium oxide are deposited as $TiO_x$, where $x$ has a value within the range of 1.3 to 1.7, the subsequently applied silver film remains stable and highly conductive, and the $TiO_x$ film has the facility to become colorless upon exposure to normal atmosphere of air. When the film is deposited as titanium monoxide, the film does not readily clear, and remains blue.

SUMMARY OF THE INVENTION

Therefore, in accordance with this invention, there is provided a method for making a transparent, colorless, electrically conductive article comprising:

a. vacuum depositing in a partial pressure of oxygen a transparent film of titanium oxide on a substrate at a rate sufficient to form a film which initially transmits blue, but which subsequently becomes colorless upon exposure of the coated article to a normal air atmosphere, b. vacuum depositing a film of silver or gold on the previously deposited titanium oxide film at a rate sufficient to form a continuous, transparent, metal film as evidenced by the metal film having a sheet resistance of less than 10 ohms per square, c. vacuum depositing in a partial pressure of oxygen a transparent film of titanium oxide on the previously applied metal film at a rate sufficient to form a film which initially transmits blue but which subsequently becomes colorless upon exposure of the coated article to a normal air atmosphere.

The substrate can be selected from rigid transparent materials such as glass, polycarbonate or flexible plastic materials such as polyester. The coated substrate has a sheet resistance of not over 10 ohms per square and a luminous transmittance of about 75 percent or more, and preferably of at least 80 percent.

DETAILED DESCRIPTION

Figure 1:
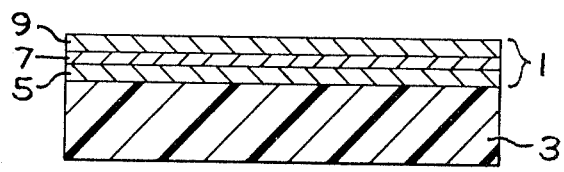
FIG. 1 is a cross-sectional view of a substrate coated by the method of the invention.

FIG. 1 shows in cross-section a transparent, electrically conductive coating 1 on a substrate 3 according to the present invention. The coating thickness has been greatly exaggerated for the purposes of illustration.

The substrate 3 can be selected from a variety of materials and a choice will be governed principally by the end use desired and by the compatibility between the coating and the substrate. Good substrates for use in vacuum coating must be unstretchable to avoid cracking the coating and non-outgassing, that is, they should not contain excessive amounts of volatile materials such as plasticizers, water vapor or absorbed gases. The films being deposited should also adhere well to the substrate surface, a property which depends on a complex interaction of the film and substrate. Generally, the coating of the invention adheres well to glass, ceramics and certain flexible plastics such as polyesters, cast acrylics, polycarbonates, chlorinated plastics and epoxies. On the other hand, polyurethanes and polyvinyl butyral are too soft and extensible for vacuum coating. The substrates preferred in the practice of the invention are either rigid, transparent materials such as glass or non-extensible flexible plastic materials such as linear polyesters, such as polyethylene terephthalate commercially available under the trademarks MYLAR and MELINEX.

The coating 1 is a composite comprising a base layer 5 deposited as $TiO_x$, where $x$ is a value greater than 1.0 but less than 2.0, preferably within the range of 1.3 to 1.7, a second layer 7 of silver or gold on the base layer and a third layer 9 deposited as $TiO_x$ on the second layer, where $x$ is a value greater than 1.0 but less than 2.0, preferably within the range of 1.3 to 1.7.

The titanium oxide layers 5 and 9 have a particular combination of properties which contribute to the overall success of the composite coating. First, the titanium oxide layers 5 and 9 form films on which the thin silver or gold metal layer becomes and remains continuous. A more normal state of such thin silver or gold layer is a discontinuous globular form. Secondly, the titanium oxide layers have a high refractive index which enables them to reflect sufficient energy out of phase with the silver reflectance such that the combination becomes anti-reflecting, that is, highly transmitting. Thirdly, titanium oxide base layers adhere extremely well to glass and relatively well to flexible plastics so that the coating is durable. Lastly, the titanium oxide overcoat layer 9 is a hard material which protects the soft underlying silver or gold from abrasion or other damage.

The proper degree of oxidation of the titanium oxide on deposition can be determined visually. Thus, when the titanium oxide layers are initially applied, they should transmit as slightly blue which quickly clears or becomes colorless upon exposure of the resultant coated substrate to a normal atmosphere of air. By the term normal atmosphere of air is meant air containing about 78 percent nitrogen and 21 percent oxygen. When the substrate is glass, a heating in air of 250° C. is required to clear the coating. This is because the glass and the intermediate metal layer act as a diffusion barrier for the oxygen. However, when the substrate is a material which is permeable to oxygen, such as a linear polyester, heating is not necessary as the base layer of titanium oxide will oxidize spontaneously at room temperature. If the film does not clear upon exposure to air and remains blue transmitting, then the film is too highly reduced. Such a film will not give the desired luminous transmittances necessary for motor vehicle glazing applications. If the titanium oxide base layer deposits as a transparent, colorless film, then the film is too highly oxidized and the coating will not have the properties required to nucleate the intermediate metal film and form a stable continuous layer.

Besides visual observation, the degree of oxidation of the $TiO_x$ coating can be determined with the quartz crystal monitoring system mentioned in the working examples which follow. Quartz crystals are used for monitoring evaporation rate and film thickness during vacuum deposition. The crystals when energized vibrate at a certain frequency which changes in response to the mass of material deposited on the crystal. Knowing the original frequency of vibration and how the frequency changes in response to deposited mass, the mass of material deposited on the crystal can be determined. This principle can be used to calculate the degree of oxidation of the titanium oxide coating being deposited. The mass of $TiO_x$ vacuum deposited on a crystal can be determined by the change in frequency of vibration of the crystal. The vacuum can then be broken and dry air introduced into the vacuum chamber. The air will oxidize the $TiO_x$ coating on the crystal to $TiO_2$, increasing the mass on the crystal which can be determined by the change in the crystal's frequency of vibration. The oxidation which occurs is depicted as follows:

$$TiO_x + \tfrac{1}{2}(2-x)O_2 \rightarrow TiO_2$$

Since the masses of $TiO_x$ and $TiO_2$ are known and the value of $\tfrac{1}{2}(2-x)O_2$ can be calculated, the value of $x$ can readily be determined.

The thickness of the titanium oxide layers should be within the range of 200 to 500 Angstroms to obtain the desired optical properties and film continuity necessary for a commercially acceptable product. Titanium oxide layers less than 200 Angstroms or greater than 500 Angstroms result in very low luminous transmittance. The titanium oxide coatings should be of a specific thickness so that interferometrically they, in combination with the intermediate metallic layer, give high luminous transmittance for the combination.

Silver or gold is chosen as the second or intermediate metal layer 7 in the composite coating because of good elecrical conductivity and low luminous absorption. Metals other than silver and gold and the alkali metals have high luminous absorption caused by interband electron transitions in the visible range. Thus, before the film becomes thick enough to give sufficient conductivity, it is already too optically dense to be acceptably transparent for applications such as automotive glazing. The alkali metals are not useful for conductive coatings because of their high reactivity.

For high conductivity and high luminous transmittance, the silver or gold film should be continuous. Even slight discontinuity in the film results in a drastic decrease in electrical conductivity and luminous transmittance. To achieve the necessary continuity, the intermediate metal film should have a thickness of at least 60 Angstroms. Thinner films become unstable, agglomerate and decrease in electrical conductance and luminous transmittance over a peiod of time. The intermediate metal film thickness, however, should not significantly exceed about 250 Angstroms in thickness because of low luminous transmittance.

The individual layers of the coating can be deposited on the substrate by vacuum coating techniques well known in the art such as vacuum evaporation or sputtering. See, for example, U.S. Pat. application Ser. No. 430,424, filed Jan. 3, 1974, now U.S. Pat. No. 3,970,660 to Frank H. Gillery and assigned to PPG Industries, Inc., the assignee of the instant invention, U.S. Pat. No. 2,665,223 to Clough et al and U.S. Pat. No. 2,971,862 to Baer et al. For vacuum coating, the substrate is positioned in an air-tight coating chamber and the chamber evacuated. For best results, the vacuum should be below $5 \times 10^{-4}$ Torr and preferably below $3 \times 10^{-4}$ Torr, usually within the range of $1.0–3.0 \times 10^{-4}$ Torr. The temperature of deposition is usually about 25° C., although deposition can be accomplished over the temperature range of 25° to 200° C., the temperature of deposition being governed by the thermal stability of the substrate and the tendency of the silver and gold to agglomerate at temperatures much above 200° C. When depositing on heat-deformable polyester sheeting, the temperature of deposition should be low, about 25° to 30° C.

Deposition of the $TiO_x$ is accomplished by vaporizing either titanium metal or titanium monoxide from a suitable source such as a tungsten boat or a water-cooled electron beam gun crucible, in a partial pressure of oxygen. Evaporation is continued until a $TiO_x$ film of the desired thickness is deposited which is established by the use of a quartz crystal monitor which indicates the thickness directly as it is being formed. Titanium monoxide vaporizes well and the rate of evaporation can be controlled by monitoring the oxygen pressure which can be initially set at about 2.5 to 2.8 × 10$^{-4}$ Torr, which drops to about 1.8 to 2.0 × 10$^{-4}$ Torr during evaporation. However, titanium monoxide is expensive and presents difficulties in recharging the evaporation source during a long-running continuous operation. For this reason, evaporation of titanium metal is preferred. Titanium metal is also easy to evaporate in oxygen at about the same partial oxygen pressure as titanium monoxide but using a slightly slower evaporation rate otherwise.

The rate at which the underlying titanium oxide layer is deposited has to be closely controlled consistent with oxygen pressure. If the rate is too fast, a highly reduced form of the oxide results which is blue transmitting and which cannot be subsequently oxidized by subsequent heating. To achieve a slower deposition rate, the titanium source is placed relatively far away from the substrate to get deposition over a large area. Depending on the parameters of the system, acceptable deposition rates give a TiO$_x$ film which is slightly blue which can be subsequently cleared as described above. A deposition rate which is too slow gives a film which is clear but too highly oxidized as evidenced by the instability of the intermediate silver layer. The silver layer will greatly increase in resistance in a short period of time.

After the base TiO$_x$ layer has been deposited, the intermediate metal layer is next deposited. The deposition of silver or gold is reasonably straight forward. The deposition rate has to be relatively fast for best results. The metal source should be placed as close to the ribbon as possible consistent with good uniformity. The deposition takes place over a small area so that the deposition rate is high giving the lowest specific resistance. Unless the metal deposition rate is kept above a threshold value, depending on the parameters of the system, a discontinuous film will form resulting in high electrical resistance value.

The overcoat layer of TiO$_x$ is deposited in the same manner as the first coating. However, it should be deposited at a temperature below 200° C. to prevent agglomeration of the underlying metal film.

The coated articles prepared by the methods disclosed above should have high conductivity or low resistance and high luminous transmittance. Accordingly, the sheet resistance of the coated article should be less than 10 ohms per square, usually within the range of 2 to 7 ohms per square, and this resistance should be stable over an extended period of time, that is, the increase in resistance should not increase more than 7 percent, based on original sheet resistance after a period of 200 days. It has been found that the greatest increase in resistance occurs within 200 days, after which only small increases will result even with the most unstable samples. The luminous transmittance should be at least about 75 percent or more, and preferably greater than 80 percent.

When the substrate material is a flexible plastic sheet such as polyethylene terephthalate the coated polyester can be used with conventional plastic interlayer materials such as polyvinyl butyral or polyurethane and laminated with glass for motor vehicle glazing applications. Thus, a thin sheet of polyethylene terephthalate coated in accordance with the invention can be positioned between two sheets of polyvinyl butyral or polyurethane and the plastic composite further sandwiched between two sheets of glass and laminated under conventional laminating conditions to form glass-plastic laminates. Besides glass, other rigid, transparent sheets could be used such as polycarbonate and acrylic. Lamination should not affect the resistance of the coating, although the visible light transmission and reflectance will be somewhat affected. However, the luminous transmittance of the resultantly prepared laminate should be at least about 70 percent or more which is the minimum required by the automotive industry, and preferably should be at least 75 percent. For motor vehicle glazing, the flexible plastic sheet should have a thickness of from about 2 to 8 mils, the individual sheets of plastic interlayer should have a thickness of from 5 to 20 mils and the rigid, transparent material should have a thickness of from about 60 to 500 mils.

DESCRIPTION OF THE PREFERRED EMBODIMENT

EXAMPLE I

Figure 2:
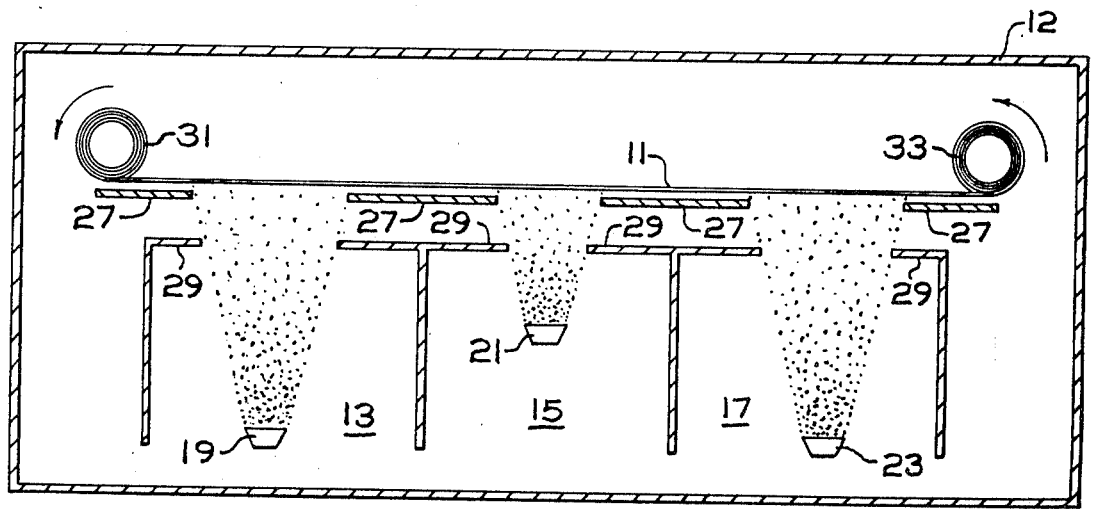
FIG. 2 is an elevated cross-sectional view of a vacuum chamber for depositing the coatings of the invention.
Figure 3:
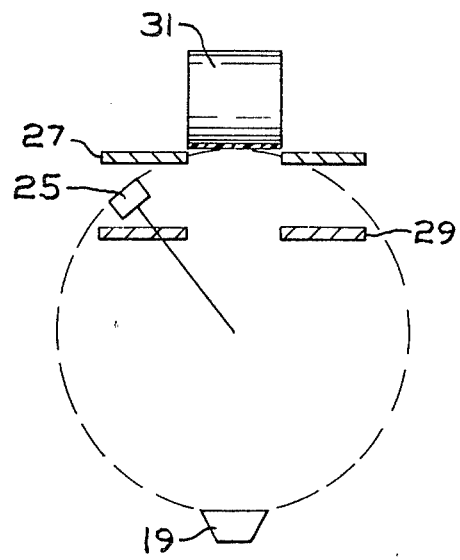
FIG. 3 is an end elevational view showing that portion of the vacuum chamber for depositing titanium oxide coatings according to the invention.
Figure 4:
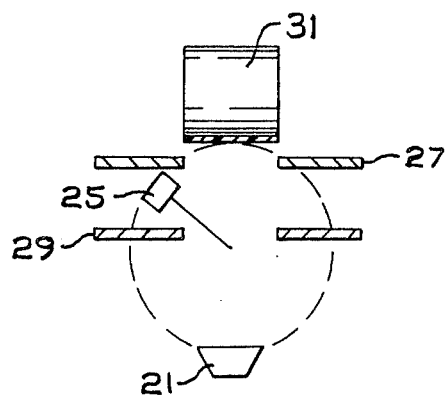
FIG. 4 is an end elevational view showing that portion of the vacuum chamber for depositing the silver or gold coating.

Referring to FIGS. 2–4, a 20-inch wide roll of polyethylene terephthalate sheeting 11 sold under the trademark MELINEX having a thickness of about 4 to 5 mils is coated in a vacuum chamber 12. The chamber is partitioned into three sections, 13, 15 and 17, section 13 is for depositing the base layer of titanium oxide, section 15 for depositing the intermediate metal layer, in this case silver, and section 17 for depositing the overcoat titanium oxide layer. The vacuum chamber is equipped with three 14-kilowatt electron beam evaporating sources (not shown) and water-cooled copper crucibles 19, 21 and 23, and a quartz crystal monitor and controller 25 as is commonly used for controlling evaporation rate and thickness of films during vacuum deposition. The evaporation rate monitors are mounted on a circle tangent to the evaporant and the ribbon surfaces such as is shown in FIGS. 3 and 4 with the monitor also tangent to the circle. This system theoretically gives the same rate of deposition on the crystal as on the ribbon. Because of scattered deposits, a double mask system 27 and 29 is used to control the particles being deposited on the ribbon. Masks are positioned between the sources of evaporation and the ribbon to give uniform deposits.

The chamber is evacuated to a pressure of approximately 5 × 10$^{-5}$ Torr and oxygen is fed into the chamber in the vicinity of the titanium sources 21 and 23 until a total pressure of about 2 × 10$^{-4}$ Torr is established while evaporation is taking place. The water-cooled copper crucibles 19 and 23 are filled with titanium and crucible 21 with silver. The electron guns are activated to heat the metal sources. The polyester ribbon is continuously driven by a motor outside the chamber from feed roll 31 to take-up roll 33 across the vapor sources 19, 21 and 23 at a ribbon speed of 44 inches per minute.

The titanium sources 19 and 23 are placed as far away from the ribbon as possible (80 centimeters) and the evaporation takes place over a large area. In this way, the deposition rate is kept low giving time for the titanium metal to oxidize on the substrate. On the other hand, the silver source is placed as close to the ribbon as possible (45 centimeters) consistent with good uniformity and the evaporation takes place over a small area so that the silver deposition rate is high, giving the best film resistance. With the existing parameters of a system generally described for FIGS. 2 to 4, deposition rate for TiO$_x$ of less than 6 Angstroms/second gives a film which is clear, that is, highly oxidized, and this leads to instability of the silver layer. A rate of 12 Angstroms/second gives a slightly blue transmitting film which clears up in time and gives much more stability to the silver. A deposition rate of 25 Angstroms per second for TiO$_x$ is as fast as can be tolerated; otherwise, the coating is too blue and either will not clear up when standing in air or takes too long to clear. A titanium oxide film of about 300 Angstroms thick for each layer is about an optimum thickness for minimum reflectance and intensity of color. This varies little with silver thickness.

The silver thickness obtained in the above process is about 150 Angstroms. Unless the silver deposition rate is kept above about 15 Angstroms/second, the resistance tends to increase at any one thickness. A normal resistance value for the 150 Angstrom thick film is about 5 ohms/square. As the thickness is increased, the reflectance and transmittance colors become stronger.

After the coating operation, the polyester sheeting is tested for electrical resistance and visible light transmittance and reflectance. The sample has a luminous transmittance of about 84 percent, a luminous reflectance of about 14 percent, and the sheet resistance is about 5 ohms per square.

A portion of the coated polyester sheeting is then sandwiched between two 15-mil thick sheets of automotive grade polyvinyl butyral which in turn are sandwiched between two sheets of ⅛ inch float glass and the structure laminated under standard automotive laminating conditions to form an automotive windshield structure, that is, at a pressure of about 275 psi and a temperature of 300° F. for about 45 minutes. The luminous transmittance of the laminated sample is about 80 percent, the luminous reflectance about 17 percent. The sheet resistance of the coating is about 5 ohms/square.

EXAMPLE II

To show the importance the degree of oxidation of the titanium oxide base layer has on stability of the intermediate metallic layer, the following comparative testing was conducted. Four sections of MELINEX film were coated as generally described in working Example I above, with the exception that the ribbon speed was varied in the depositing of the TiO$_x$ layers so as to control the degree of oxidation. The various ribbon speeds and deposition rates for the TiO$_x$ layers are reproduced in the table below.

Table I

| Ribbon Speeds and Deposition Rates of Titanium Oxide Layers | | |
|---|---|---|
| Sample No. | Ribbon Speed | Deposition Rate |
| 1 | 44 inches per minute | 18.5 Angstroms per minute |
| 2 | 33 inches per minute | 14.1 Angstroms per minute |
| 3 | 22 inches per minute | 9.25 Angstroms per minute |
| 4 | 11 inches per minute | 4.4 Angstroms per minute |

The higher the ribbon speed is, the more reduced is the titanium oxide coating. In all cases, the base and overcoat layers of TiO$_x$ were about 250 Angstroms thick and the overcoat layer of TiO$_x$ was deposited at the same rate as the base layer. The intermediate silver layer was deposited in all cases at a ribbon speed of 44 inches per minute and at a deposition rate of 13 Angstroms per minute. The thickness of the silver layer was about 160 Angstroms. The initial sheet resistance of the composite coating was about 4 to 5 Angstroms in all cases regardless of the degree of reduction of the TiO$_x$ base layer.

Eight 4 inch by 4 inch square samples of the coated MELINEX film, two samples of each degree of TiO$_x$ oxidation, were selected for lamination. Silver bus bars were applied to the coatings and copper lead wires extending beyond the sheeting were affixed to the bus bars so that the sheet resistance of the coatings could be determined after lamination. The coated MELINEX films were positioned between two 4 inch by 4 inch by 15 mil thick layers of polyvinyl butyral which in turn were sandwiched between two 4 inch by 4 inch by ⅛ inch thick glass sheets and the entire assembly laminated at a pressure of about 275 pounds per square inch at a temperature of 300° F. for about 45 minutes to form a unitary laminate structure.

The laminates, numbering eight in all, were then divided into two groups. Each group had one sample of each degree of TiO$_x$ oxidation. One group was stored at room temperature and the other group was stored in an oven at 150° F. After 200 days, the samples were tested for electrical resistance. The results are reported in the table below.

Table II

| Increase in Resistance of Laminated Samples After 200 Days | | | |
|---|---|---|---|
| | | Percent Increase in Sheet Resistance | |
| Sample No. | Ribbon Speed | Room Temperature Exposure | 150° F. Exposure |
| 1 | 44 inches per minute | 2 | 3 |
| 2 | 33 inches per minute | 4.5 | 7 |
| 3 | 22 inches per minute | 6.5 | 7 |
| 4 | 11 inches per minute | 8.5 | 10 |

Throughout this specification, luminous transmittance is defined as the summation of the precentage of incident, visible radiant energy (weighted by the energy distribution of the source and the eye's sensitivity) that will pass through the glass as described. In the present invention, the source, unless otherwise stated, is Illuminant C, a standard source adapted by the International Commission on Illumination. Luminous transmittance can be measured by standard spectrophotometric methods, such as by using a Beckman Quartz Spectrophotometer, Model DK-2A.

Sheet resistance of coated substrate is a measure of the resistance of the intermediate silver or gold film, the TiO$_x$ films being non-conductive. Sheet resistance can be measured, as is well known in the art, between silver bus bars in contact with the intermediate metallic layer or with a conventional ohm meter.

I claim:

1. A transparent, colorless article comprising in combination:

a. a transparent substrate, b. a first transparent layer having a thickness of from 200 to 500 Angstroms affixed to said substrate deposited as TiO$_x$, where $x$ is a value greater than 1.3 but less than 1.7, c. a second transparent layer of metal selected from the class consisting of silver and gold having a thickness of from 60 to 250 Angstroms overlying and affixed to said first transparent layer; and having a sheet resistance of less than 10 ohms per square, d. a third transparent layer having a thickness of from 200 to 500 Angstroms overlying and affixed to said second transparent layer deposited as TiO$_x$, where $x$ is a value greater than 1.3 but less than 1.7; said coated article having a luminous transmittance of at least 80 percent.

2. The article of claim 1 in which the transparent layers are vacuum deposited.

3. The article of claim 1 in which the substrate is a rigid transparent material or a flexible plastic material.

4. The article of claim 3 in which the rigid transparent material is glass.

5. The article of claim 3 in which the flexible plastic material is polyester.

6. A transparent laminated window having a luminous transmittance of about 70 percent or more, comprising in combination:
   a. a rigid transparent sheet,
   b. a flexible plastic layer having a transparent, clear, electrically conductive coating thereon, said coating comprising:
      i. a first transparent layer having a thickness of from 200 to 500 Angstroms on said flexible plastic deposited as $TiO_x$, where $x$ is a value greater than 1.3 but less than 1.7,
      ii. a second transparent layer of metal selected from the class consisting of silver and gold having a thickness of from 60 to 250 Angstroms and a sheet resistance of less than 10 ohms per square on said first layer,
      iii. a third transparent layer having a thickness of from 200 to 500 Angstroms on said second layer deposited as $TiO_x$, where $x$ is a value greater than 1.3 but less than 1.7.

7. The laminated window of claim 6 which is electrically conductive with the coated flexible plastic layer having a sheet resistance of 10 or less ohms per square.

8. The laminated window of claim 6 in which the rigid transparent sheet is selected from the class consisting of acrylic, glass or polycarbonate.

9. The laminated window of claim 6 wherein two layers of glass sandwich the flexible plastic layer.

10. The laminated window of claim 9 in which the flexible plastic layer is polyester, which in turn is sandwiched between two layers of polyvinyl butyral which in turn are sandwiched between two layers of glass.

11. The laminated window of claim 10 in which the polyester has a thickness of from 2 to 8 mils, polyvinyl butyral has a thickness of from 5 to 20 mils, and the glass has a thickness of from 60 to 500 mils.

* * * * *